United States Patent
Ishizaki

(10) Patent No.: US 8,903,310 B2
(45) Date of Patent: Dec. 2, 2014

(54) WIRELESS COMMUNICATION APPARATUS

(75) Inventor: Haruya Ishizaki, Tokyo (JP)

(73) Assignee: NEC Corporation, Tokyo (JP)

( * ) Notice: Subject to any disclaimer, the term of this patent is extended or adjusted under 35 U.S.C. 154(b) by 168 days.

(21) Appl. No.: 13/579,836

(22) PCT Filed: Feb. 24, 2011

(86) PCT No.: PCT/JP2011/054817
§ 371 (c)(1),
(2), (4) Date: Aug. 17, 2012

(87) PCT Pub. No.: WO2011/108616
PCT Pub. Date: Sep. 9, 2011

(65) Prior Publication Data
US 2012/0322381 A1   Dec. 20, 2012

(30) Foreign Application Priority Data
Mar. 3, 2010  (JP) .................... 2010-046474

(51) Int. Cl.
*H04B 5/00*  (2006.01)
*H04B 1/38*  (2006.01)
*H03F 3/189*  (2006.01)
*H04W 52/52*  (2009.01)
*H03F 1/02*  (2006.01)

(52) U.S. Cl.
CPC ........... *H04W 52/52* (2013.01); *H03F 3/189* (2013.01); *H03F 2200/405* (2013.01); *H03F 1/0261* (2013.01)
USPC .............. 455/41.1; 455/343.1; 455/574

(58) Field of Classification Search
CPC ... H02M 1/42; H02M 1/0032; H02M 5/4585; G06F 1/26
USPC .............. 455/41.1, 343.1, 343.2, 572, 574; 370/311
See application file for complete search history.

(56) References Cited

U.S. PATENT DOCUMENTS

| | | | |
|---|---|---|---|
| 6,674,271 B2* | 1/2004 | Choo et al. ............. | 363/21.16 |
| 8,160,636 B2* | 4/2012 | Tadokoro ............... | 455/41.1 |
| 8,583,075 B2* | 11/2013 | Chen et al. ............. | 455/343.2 |
| 2008/0080214 A1* | 4/2008 | Umeda et al. ........... | 363/37 |

FOREIGN PATENT DOCUMENTS

| | | |
|---|---|---|
| JP | 2004-134981 A | 4/2004 |
| JP | 2005-121588 A | 5/2005 |

(Continued)

OTHER PUBLICATIONS

Po-Chiun Huang et al., A 2-V 10.7-MHz CMOS Limiting Amplifier/RSSI, IEEE Journal of Solid-State Circuits, vol. 35, No. 10, Oct. 2000, pp. 1474-1480.

*Primary Examiner* — Quochien B Vuong
(74) *Attorney, Agent, or Firm* — Foley & Lardner LLP

(57) ABSTRACT

A wireless communication apparatus is capable of generating a gain/noise characteristics control signal for an amplifier and a filter without degrading an amount of electrical power, or distance information contained in the electrical power. The wireless communication apparatus includes: a rectifier circuit; a circuit power supply for receiving electrical power from the rectifier circuit so as to supply required electrical power; a sampling circuit for performing sampling on an output of the rectifier circuit; a discrete filter capable of performing discrete processing on an output of the sampling circuit so as to selectively remove a frequency component contained in the output of the sampling circuit; and power control for controlling a bias required for a radio transmitter and/or a radio receiver based on the DC component output from the discrete filter.

8 Claims, 3 Drawing Sheets

(56) References Cited

FOREIGN PATENT DOCUMENTS

| | | |
|---|---|---|
| JP | 2008-85818 A | 4/2008 |
| JP | 2008-172974 A | 7/2008 |
| JP | 2008-232280 | 10/2008 |
| WO | WO 2010/029964 A1 | 3/2010 |

* cited by examiner

WIRELESS COMMUNICATION APPARATUS

This application is the National Phase of PCT/JP2011/054817, filed Feb. 24, 2011, which claims priority to Japanese Application No. 2010-046474, filed Mar. 3, 2010, the disclosures of which are hereby incorporated by reference in their entirety.

TECHNICAL FIELD

This invention relates to power reduction in a short-range wireless network, and more particularly, to an efficient usage of electrical power in a wireless communication apparatus.

BACKGROUND ART

Applications of the short-range wireless network having a range of several centimeters to several meters are now being proposed and technologies for satisfying those applications are also now being developed. As a typical example, wireless personal area networks (WPANs, assumed communication range of about one meter to ten meters) have become widespread and further, wireless body area networks (WBANs, assumed communication range of about several centimeters to three meters) have been proposed and standardization for WBANs is now underway. As measures for satisfying requests for power reduction (for example, battery life of several years) and cost reduction (for example, chip cost of one dollar or less), which are unique to such short-range wireless technology, there has conventionally been adopted an RF circuit developed under the digital CMOS technology or an architecture having digitized control and signal processing, to thereby scale down the device dimension of the CMOS of a radio LSI so as to reduce a chip area and power supply voltage.

In recent years, on the other hand, there has been proposed an approach for attaining such goal through a method that is performed without scaling down the device dimension of the CMOS, although this approach has the same problem awareness of satisfying the above-mentioned requests. For example, there has been proposed a technology called energy harvesting in which vibration and light applied to a chip are converted into electrical power to be supplied to a power supply by using an acceleration sensor and a solar cell so as to provide a battery-less short-range radio terminal, such as a sensor network. According to this method, electrical power to be supplied from a battery to a circuit can be lowered or eliminated without reducing consumed electrical power by scaling down the device dimension. In the method for attaining power reduction by scaling down the device dimension, it is necessary to lower the power supply voltage, but a low power supply voltage is not appropriate for a radio circuit which requires a dynamic range of 100 dB or larger in terms of power ratio. The energy harvesting technology is therefore more advantageous than the method for attaining power reduction by scaling down the device dimension in that it is possible to eliminate the user's time and effort for replacing the battery without degrading the performance of the radio circuit. However, even the energy harvesting technology cannot achieve the cost reduction because the acceleration sensor and the solar cell, which are provided outside the chip, are required as described above.

In view of the problem that the performance of the RF circuit is degraded through the approach for attaining power reduction and cost reduction by scaling down the device dimension and also the problem that the cost rises through the approach for attaining a battery-less device by energy harvesting, the inventor of this invention proposes an LSI technology for recovering electrical power from a frequency-multiplexed signal in Japanese Patent Application No. 2008-232280 (Patent Literature 1), which is scheduled to be published after the filing of the subject application. According to this technology, communication energy that can be always acquired from a transmitter to be a communication destination is acquired as data, and hence electrical power supplied from the battery can be reduced without scaling down the device dimension. In addition, a commonly-available CMOS can be used at any time to form the device on the LSI, and hence there is no cause of cost rise as in the energy harvesting. However, even this LSI technology for recovering electrical power has a limit in that this LSI technology is a technology for reducing only the electrical power of the terminal as in other conventional technologies and is thus not a technology for attaining power reduction by optimizing an entire wireless network that changes every moment.

Non Patent Literature 1 proposes a CMOS circuit having low power consumption for an intermediate frequency limiting amplifier and a received signal strength indicator of a radio receiver circuit. The CMOS circuit is employed so as to attain low power consumption and, in order to generate a control signal for a receiver circuit, by focusing attention on the fact that the strength of an intermediate frequency signal that is down-converted in the receiver contains information on the distance to a destination terminal, a DC voltage component corresponding to the signal strength is output to obtain the control signal for a reception dynamic range in a variable gain amplifier, for example.

FIG. 1 is a diagram illustrating a part of the contents disclosed in the Non Patent Literature. A signal input from an intermediate frequency input 101 is sent to an intermediate frequency amplifier 102 having seven stages connected in series, and is amplified at each stage.

An output branched from each amplifying stage is sent to a full-wave rectifier 104, and a voltage level thereof is converted into a current level by a smoothing filter 105, and after that, smoothed by a smoothing filter 105. Then, a DC voltage corresponding to a signal amplitude at the intermediate frequency input 101 is output to a received signal strength indicator output 106. This signal is used for gain control by a first-stage amplifier on the receiver side, for example.

Patent Literature 2 describes that, as an energy source for functional elements having a sensing function and a wireless radio communication function, a high-frequency energy of a carrier wave is converted into a DC signal by the rectifier circuit, and then the resultant signal is stored in a capacitor and is used for a processing circuit of portions having those functions.

CITATION LIST

Patent Literature 1: Japanese Patent Application 2008-232280
Patent Literature 2: Japanese Unexamined Patent Application Publication (JP-A) No. 2004-134981
Non Patent Literature 1: Po-Chiun Huang, et al, "A 2-V 10.7-MHz CMOS Limiting Amplitier/RSSI" IEEE JOURNAL OF SOLID-STATE CIRCUITS, VOL. 35, NO. 10, OCTOBER 2000 1474-1480

SUMMARY OF THE INVENTION

Problem to be Solved by the Invention

The technology of Non Patent Literature 1 detects the received signal strength so as to control the amplifier, but does not have a function of recovering electrical power.

Further, signals processed in Non Patent Literature 1 are all in an analog state, and hence the passive elements required for the smoothing filter 105 have very large areas. In this example, a resistor (8.3 kΩ) and a capacitor (1 nF) have such large areas that the resistor and the capacitor are disposed outside the LSI.

It is an object of this invention to provide a wireless communication apparatus capable of supplying, for use in the communication apparatus, electrical power regenerated from a received signal and stored in a capacitor or the like by a radio circuit and also capable of generating a gain/noise characteristics control signal for an amplifier and a filter without degrading an amount of the electrical power and the distance information contained in the electrical power.

Means to Solve the Problem

In order to solve the above-mentioned problem, according to the present invention, there is provided a wireless communication apparatus for receiving an electrical signal which is data-modulated as an input, including: a rectifier circuit for converting an AC component of the input electrical signal into a DC component; a circuit power supply for receiving electrical power from the rectifier circuit so as to supply required electrical power; a sampling circuit for performing sampling on an output of the rectifier circuit at predetermined time intervals; a discrete filter capable of performing discrete processing on an output of the sampling circuit so as to selectively remove a frequency component contained in the output of the sampling circuit; and power control means for controlling a bias required for a radio transmitter and/or a radio receiver based on the DC component output from the discrete filter.

According to another aspect of the present invention, there is provided a control method for a wireless communication apparatus, including: receiving an electrical signal which is data-modulated; rectifying an AC component of the electrical signal into a DC component; receiving rectified electrical power so as to supply required electrical power to at least a radio receiver; and controlling a bias required for a radio transmitter and/or the radio receiver in accordance with the rectified electrical power.

Effect of the Invention

According to the exemplary embodiment of this invention, it is possible to perform electrical power recovery which cannot be performed in the radio receiver having a conventional configuration, and also possible to generate the control signal for the amplifier and the like without degrading the recovered electrical power and the distance information contained therein. It is therefore possible to reconfigure a network through analog control by reading the distance information from the received signal components recovered as the electrical power.

MODE FOR EMBODYING THE INVENTION

Figure 1:
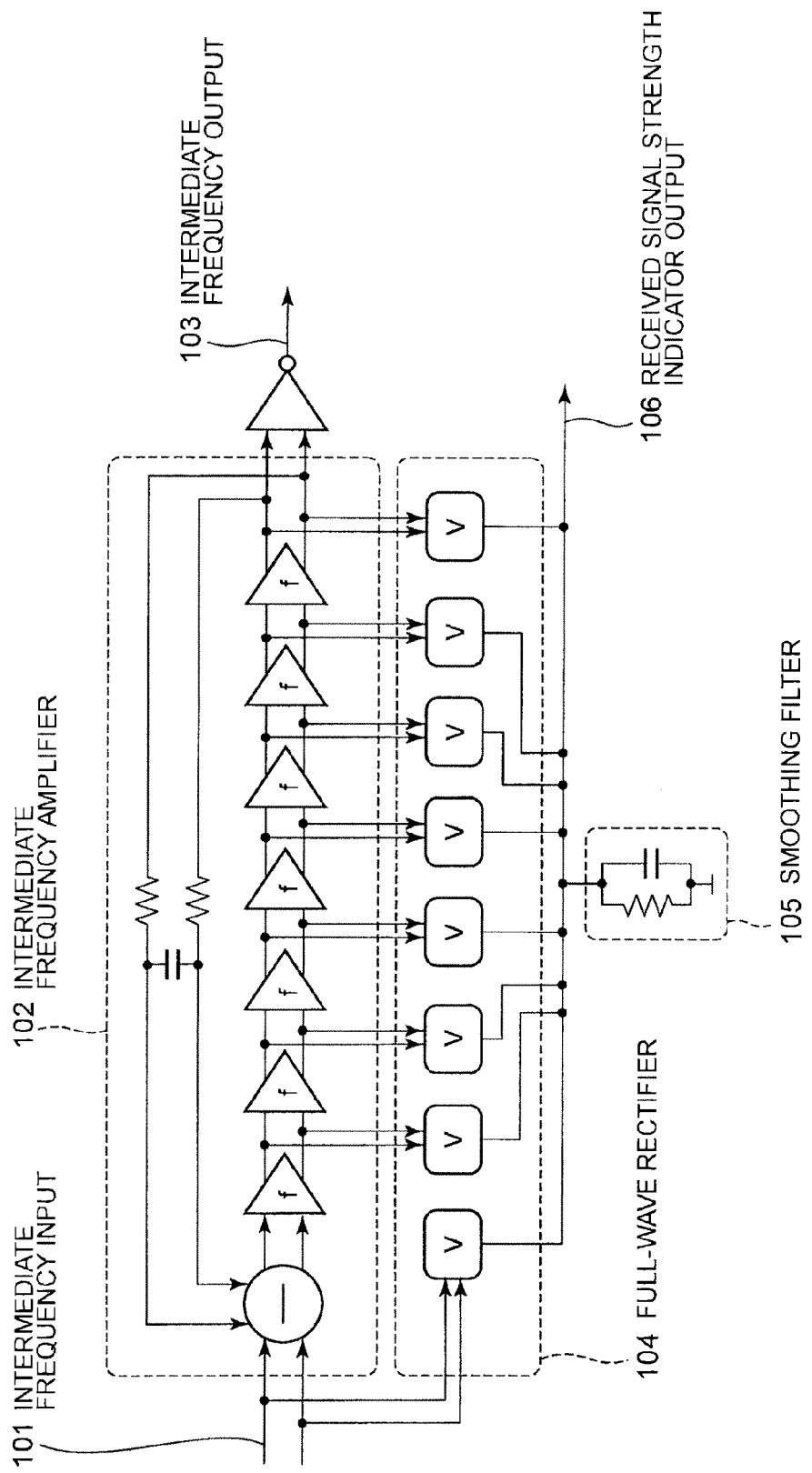
FIG. 1 is a diagram illustrating configurations of an intermediate frequency amplifier and a received signal strength indicator in a conventional radio receiver.

Hereinafter, referring to the drawings, a detailed description is given of an exemplary embodiment of this invention. Note that, this invention is not limited to this exemplary embodiment.

Figure 2:
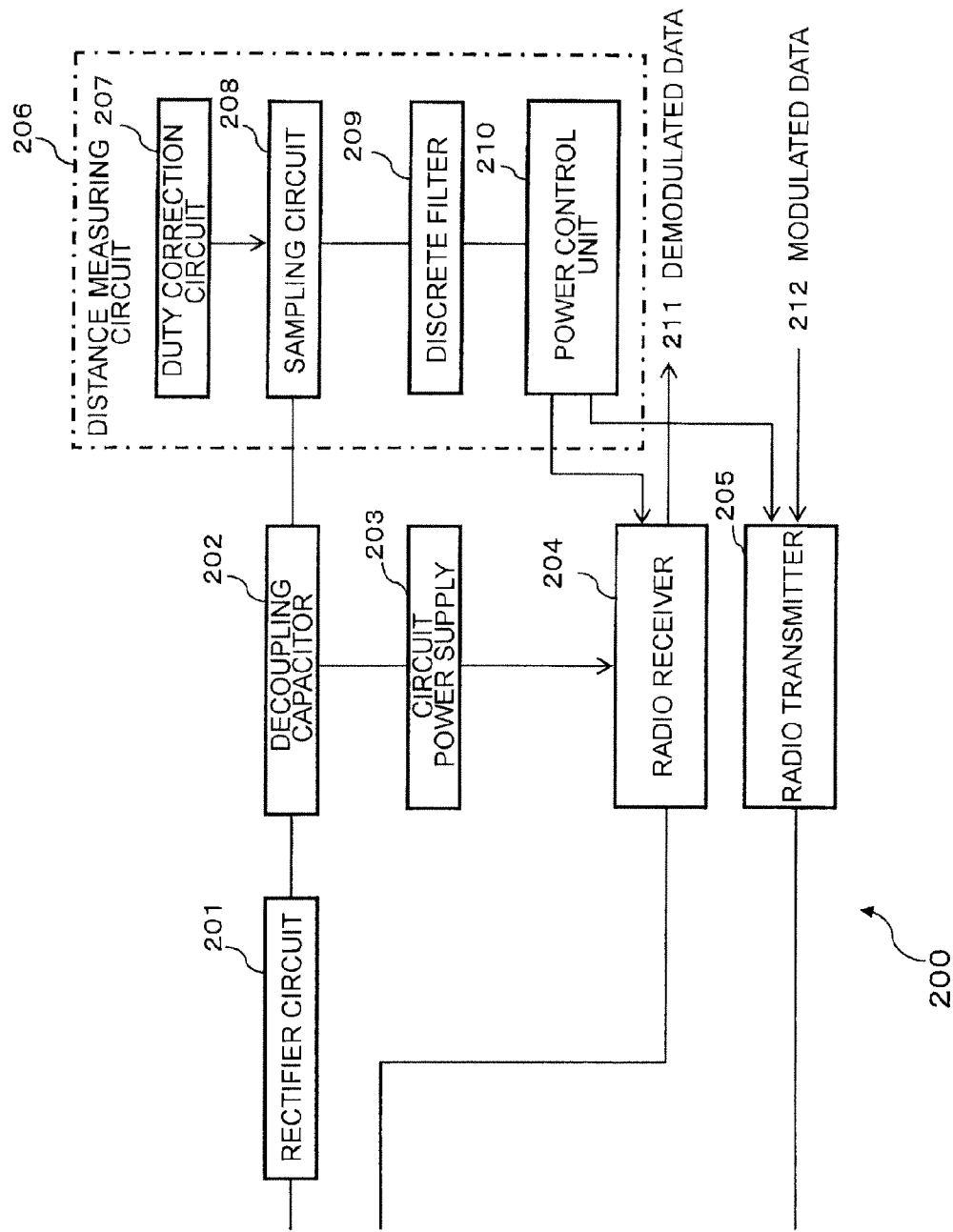
FIG. 2 is a block diagram illustrating a first exemplary embodiment of this invention.

FIG. 2 is a block diagram illustrating a configuration of a radio transmitter/receiver (wireless communication apparatus) capable of autonomously reconfigure a network according to a first exemplary embodiment of this invention. A wireless communication apparatus 200 includes a radio receiver 204, a radio transmitter 205, a rectifier circuit 201, a decoupling capacitor 202, a circuit power supply 203, and a distance measuring circuit 206. The distance measuring circuit has a function of acquiring distance information based on the level of a received electrical signal. The distance measuring circuit 206 includes a sampling circuit 208, discrete filter 209, a power control unit 210, and a duty correction circuit 207. In the exemplary embodiment it is assumed that the wireless communication apparatus uses a signal obtained by an antenna or the like converting a radio signal transmitting in a space as an electromagnetic wave into an electrical signal. The signal to be received may be any one of a frequency-multiplexed signal and a single-carrier signal. In FIG. 2, the signal received by wireless communication is input to each of the rectifier circuit 201 and the radio receiver 204, which are disposed in parallel to each other, at the same time or in a time-shared manner. In response to signal input to the radio receiver 204 a digital signal is output as demodulated data 211. On the other hand, in response to the signal input to the rectifier circuit 201 an output is sent to the decoupling capacitor 202, and is stored therein as electrical power. The electrical power stored in the decoupling capacitor 202 is sent to the circuit power supply 203 with a low impedance and, at the same time, is output in parallel so as to be subjected to sampling in the sampling circuit 208 with a high input impedance. The circuit power supply 203 sends the electrical power to respective blocks that need electrical power. The other portions of the configuration are the same as those of Patent Literature 1, and hence descriptions thereof are omitted herein. Meanwhile, the electrical power stored in the decoupling capacitor 202 is subjected to sampling in the sampling circuit 208, and a duty ratio of a sampling clock is corrected in the duty correction circuit 207 that is disposed in a previous stage of a clock which is input to the sampling circuit 208. Further, the sampling circuit 208 has its output supplied to the discrete filter. The signal output from the sampling circuit 208 contains both the value of the electrical power in the decoupling capacitor 202, which has been subjected to sampling and has no frequency component, and a noise component, but the noise component is removed in the discrete filter 209. Therefore, the signal is to have only the value of the electrical power in the decoupling capacitor 202. An output signal of the discrete filter 209 whose noise component has been removed is sent to the power control unit 210, is then sent to the radio transmitter 205 and the radio receiver 204 while the signal remains as an analog value, and is used for a DC bias value for gain and noise control. The distance measuring circuit 206 acquires distance information based on the electrical power level of the received electrical signal, and uses the distance information as its control signal. In this exemplary embodiment, in order to generate the control signal for the radio transmitter 205 and the radio receiver 204 based on the amount of recovered electrical power, in place of the passive elements, the sampling circuit and the discrete filter are used for the processing.

Figure 3:
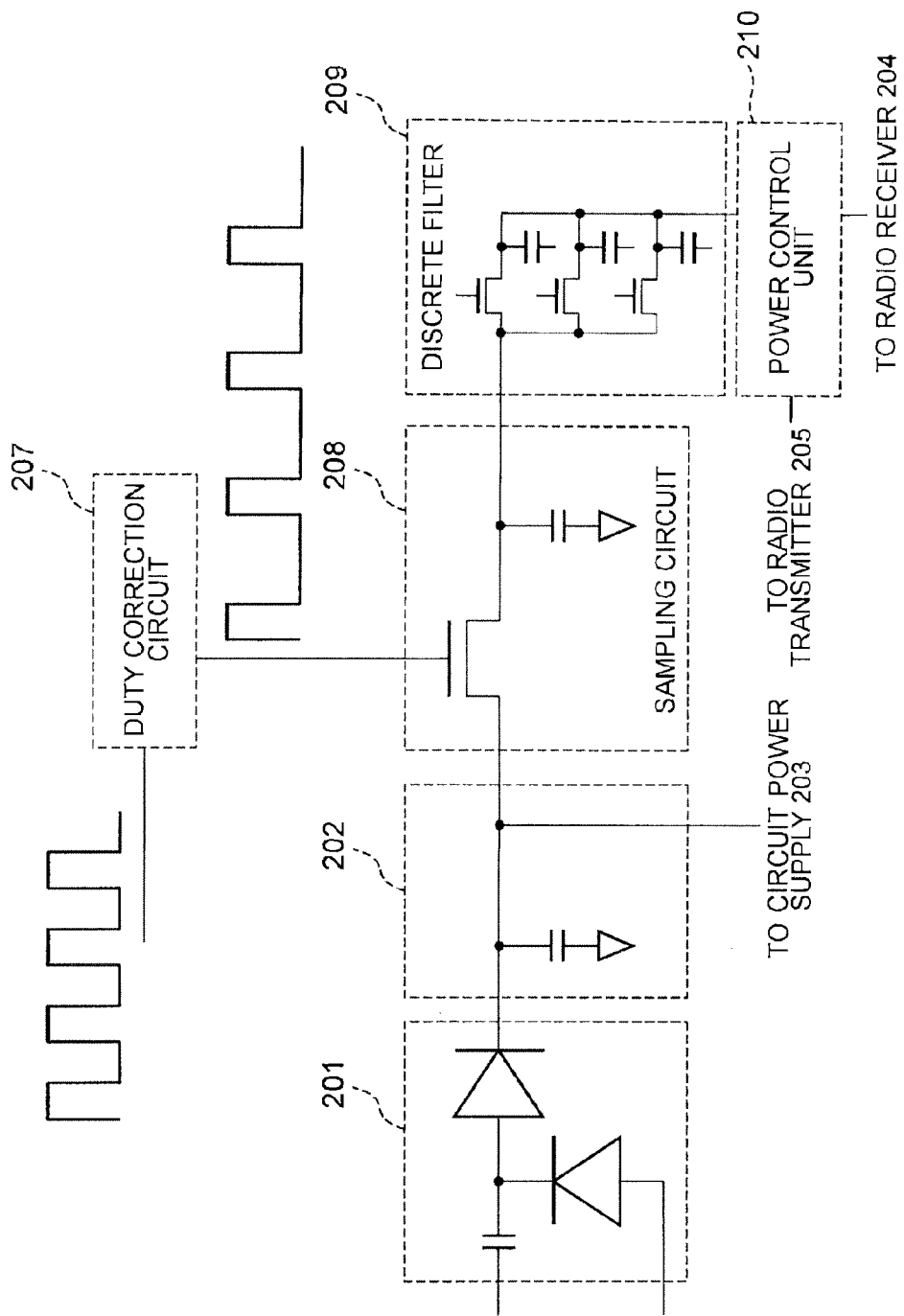
FIG. 3 is a circuit diagram illustrating details of a main part of the first exemplary embodiment of this invention.

Referring to FIG. 3 as well as the block diagram of FIG. 2, a detailed description is now given of an operation of the radio transmitter/receiver circuit according to this exemplary embodiment. For starting data communication between transmitter/receiver terminals, under the rule that the transmitter side outputs the signal having a given fixed strength, outputs of respective transmitters are controlled to have the same strength. Through such control, the amount of electrical power to be recovered on the receiver side is to have a value determined in accordance with distance attenuation between the transmitter/receiver terminals. Under this rule, the signal which has been converted into the electrical signal in the above-mentioned antenna or the like is subjected to full-wave rectification or half-wave rectification in rectifying elements of the rectifier circuit 201 illustrated in FIG. 3 (in this example, full-wave rectification is illustrated). The rectified reception signal charges the decoupling capacitor. The potential difference appearing in the decoupling capacitor is represented as a potential difference between electrodes that is determined in accordance with electrical charges obtained by subtracting a fixed amount consumed as electrical power for driving the circuit, which is to be described later, and the capacitance value. This potential difference varies depending on the distance between the transmitter/receiver terminals, and thus has distance information. The electrical power stored in the decoupling capacitor is therefore supplied to both the circuit power supply and the distance measuring circuit, and is used for driving the circuit and measuring the distance in a distributed manner. Note that, the electrical power stored in the capacitor needs to be supplied as electrical power for driving the circuit without a loss and, further, the input signal to the distance measuring circuit, which is a DC signal, does not need to be output from the decoupling capacitor with a low impedance, and hence it is preferred from the viewpoint of a power usage efficiency that the former be used as a low-impedance output and the latter be used as a high-impedance output. However, a signal processing system having a high impedance which is formed of passive elements so as to constitute the circuit occupies an excessive layout area due to a resistor, which causes an increase in chip cost. In view of this, in this exemplary embodiment, a necessary processing system having a high impedance is formed through signal processing. First, the sampling circuit 208 connected to the decoupling capacitor includes a sampling switch and a sampling capacitor, and performs sampling on the potential level stored in the decoupling capacitor in accordance with a predetermined sampling frequency, and then the resultant signal is stored in the sampling capacitor. In this example, the signal to be subjected to sampling is the DC signal and the noise to be described later, and a high-order anti-aliasing filter is thus not required, and hence the frequency of the sampling clock only needs to exceed the Nyquist frequency, which enables the contained noise to be removed by the discrete filter. Meanwhile, when the duty ratio of the clock is reduced, an input impedance is narrowed, in other words, the input impedance is increased. It is therefore possible to obtain an effect equivalent to that obtained in a ease of using passive elements having a large area in order to realize a high impedance close to the DC signal through the processing on the time axis.

Note that, when an input impedance is varied on the time axis as in this system of this exemplary embodiment, it is necessary to add a circuit for correcting duty variation. The duty correction circuit 207 of FIG. 3, which is disposed in the previous stage of an input of the sampling clock, corresponds to this circuit. Further, when the signal is input with a high impedance, desired signal components are more disturbed by noise as compared with the case of a low impedance. For example, when an input impedance to the distance measuring circuit is increased by reducing the transistor size of the sampling switch or reducing the duty ratio of the sampling clock, the electrical charges that can be stored in the sampling capacitor are lowered and the capacitance value thereof needs to be lowered, which means that the value containing the distance information stored in the sampling capacitor is also disturbed further due to noise that flows in instantaneously. In order to solve this problem, by utilizing a feature of the configuration of this exemplary embodiment that a desired signal input to the distance measuring circuit is a DC component and components other than the DC component may be regarded as noise and, further, the signal to be processed in this part is a signal which has been subjected to sampling, low-pass filters for arithmetic operations between sampling signals, such as moving average calculation, are connected in series so as to remove the noise component other than the DC component. With this configuration, the conventional processing of removing noise by low-pass filters having such large capacitances that the low-pass filters are required to be disposed outside the LSI as described in Non Patent Literature 1 can be replaced with an equivalent configuration through discrete processing having a high impedance, and it is therefore possible to extract the DC component to be the distance information based on regenerated electrical power through use of a circuit having a reduced area.

The DC component acquired through the above-mentioned processing is distributed by a mirror circuit (not shown) of the power control unit 210 as a gain and a noise control bias of an amplifier and a filter on the receiver side (both not shown) built in the radio receiver 204 and as a gain control bias of an amplifier on the transmitter side (not shown) built in the radio receiver 205.

A description is now given of an effect of this exemplary embodiment. According to this exemplary embodiment, it is possible to read the distance information based on the regenerated electrical power without using the passive elements having large areas and also possible to set the input control bias of the amplifier and the filter circuit (both not shown) included in the radio receiver so as to minimize the electrical power of the radio transmitter/receiver circuit. Therefore, it is not necessary to provide a digital baseband dedicated for measuring the distance, and further, it is also possible to supply the regenerated electrical power to the electrical power for driving the circuit while reading the distance information.

The wireless communication apparatus described above in this exemplary embodiment can provide an autonomous network reconfiguration function capable of recovering the DC electrical power by the rectifier circuit and the capacitor. The wireless communication apparatus controls the duty ratio of the sampling clock based on the DC electrical power so as to read the DC voltage level with a high impedance. The discrete filter smoothes the signal acquired in the sampling circuit through discrete time processing so as to remove noise generated with a high impedance. The DC signal acquired in the discrete filter is appropriately distributed by the mirror circuit or the like in accordance with a communication state to the bias for the amplifier on the transmitter side and the filter and the amplifier on the receiver side. In this manner, the wireless communication apparatus controls the electrical power.

According to this exemplary embodiment, it is possible to realize both the recovery of electrical power and the distance measurement at the same time, which cannot be realized in the radio receiver having a conventional configuration. It is therefore possible to reconfigure the network through analog control by reading the distance information from the component of the received signal extracted as electrical power. Moreover, in place of the passive elements having large areas, the sampling circuit and the discrete filter are used for the processing of acquiring the distance information based on the recovered electrical power, and hence cost rise can be avoided.

The invention claimed is:

1. A wireless communication apparatus for receiving an electrical signal which is data-modulated as an input, comprising:
    a rectifier circuit for converting an AC component of the input electrical signal into a DC component;
    a circuit power supply for receiving electrical power from the rectifier circuit so as to supply required electrical power;
    a sampling circuit for performing sampling on an output of the rectifier circuit at predetermined time intervals;
    a discrete filter capable of performing discrete processing on an output of the sampling circuit so as to selectively remove frequency components contained in the output of the sampling circuit; and
    power control means for controlling a bias required for a radio transmitter and/or a radio receiver based on the DC component output from the discrete filter.

2. A wireless communication apparatus according to claim 1, wherein the circuit power supply and the discrete filter receive the electrical power from the rectifier circuit via a decoupling capacitor which is electrically connected to the output of the rectifier circuit.

3. A wireless communication apparatus according to claim 1, further comprising a duty correction circuit capable of selectively controlling a duty ratio of a sampling clock to be supplied to the sampling circuit.

4. A wireless communication apparatus according to claim 1, wherein the discrete filter comprises a discrete filter having low pass characteristics for the output of the sampling circuit.

5. A wireless communication apparatus according to claim 1, wherein the duty correction circuit performs control so that an input to the sampling circuit has a higher impedance than an impedance of an input to the circuit power supply.

6. A wireless communication apparatus according to claim 1, wherein the wireless communication apparatus has an autonomous network reconfiguration function.

7. A wireless communication apparatus for receiving an electrical signal which is data-modulated as an input, comprising:
    a rectifier circuit for converting an AC component of the input electrical signal into a DC component;
    a circuit power supply for receiving electrical power from the rectifier circuit so as to supply required electrical power to at least a radio receiver; and
    power control means for controlling a bias required for a radio transmitter and/or the radio receiver in accordance with an output level of the rectifier circuit,
    wherein the circuit power supply receives the electrical power from the rectifier circuit via a decoupling capacitor which is electrically connected to an output of the rectifier circuit.

8. A wireless communication apparatus for receiving an electrical signal which is data-modulated as an input comprising:
    a rectifier circuit for converting an AC component of the input electrical signal into a DC component:
    a circuit power supply for receiving electrical power from the rectifier circuit so as to supply required electrical power to at least a radio receiver;
    power control means for controlling a bias required for a radio transmitter and/or the radio receiver in accordance with an output level of the rectifier circuit;
    a sampling circuit for performing sampling on an output of the rectifier circuit at predetermined time intervals; and
    a discrete filter capable of performing discrete processing on an output of the sampling circuit so as to selectively remove a frequency component contained in the output of the sampling circuit,
    wherein the power control means controls the bias required for the radio transmitter and/or the radio receiver based on the DC component output from the discrete filter.

* * * * *